US008258238B2

(12) United States Patent
Boersma

(10) Patent No.: US 8,258,238 B2
(45) Date of Patent: Sep. 4, 2012

(54) ACTUATOR COMPRISING AN ELECTROACTIVE POLYMER

(75) Inventor: Arjen Boersma, 's-Hertogenbosch (NL)

(73) Assignee: Nederlandse Organisatie voor toegepast-natuurwetenschappelijk Onderzoek TNO, Delft (NL)

( * ) Notice: Subject to any disclaimer, the term of this patent is extended or adjusted under 35 U.S.C. 154(b) by 233 days.

(21) Appl. No.: 12/294,985

(22) PCT Filed: Apr. 4, 2007

(86) PCT No.: PCT/NL2007/050138
§ 371 (c)(1),
(2), (4) Date: Feb. 5, 2009

(87) PCT Pub. No.: WO2007/114699
PCT Pub. Date: Oct. 11, 2007

(65) Prior Publication Data
US 2010/0176691 A1 Jul. 15, 2010

(30) Foreign Application Priority Data
Apr. 5, 2006 (EP) .................................... 06075808

(51) Int. Cl.
*C08F 8/00* (2006.01)

(52) U.S. Cl. ........ 525/131; 525/123; 525/127; 525/185; 525/186; 525/187; 525/190; 525/405; 525/445; 525/455; 252/62.9 R; 264/104

(58) Field of Classification Search .................. 525/123, 525/127, 131, 185, 186, 187, 190, 405, 445, 525/455; 264/104; 252/62.9 R
See application file for complete search history.

(56) References Cited

U.S. PATENT DOCUMENTS

| | | | |
|---|---|---|---|
| 6,268,112 B1 | 7/2001 | Satou | |
| 6,388,043 B1 * | 5/2002 | Langer et al. | ................... 528/80 |
| 2004/0232807 A1 | 11/2004 | Pelrine et al. | |
| 2004/0263028 A1 | 12/2004 | Pei et al. | |

FOREIGN PATENT DOCUMENTS

| | | |
|---|---|---|
| CN | 2006-49418 | 2/2006 |
| EP | 1 137 308 A1 | 4/1985 |
| EP | 1 382 627 A2 | 1/2004 |
| GB | 2 188 585 A | 10/1987 |
| WO | WO 99/54423 | 10/1999 |

OTHER PUBLICATIONS

Jung, Y.C.; Goo, N.S.; Cho. J.W.; Proceedings of SPIE, vol. 5385, 2004, p. 230-234.*
Malhotra, B.D.; Handbook of Polymers in Electronics, 2002, p. 113-114.*
Schwartz, B.J.; Nature Materials, 2008(7), p. 427-428.*
Spindler, R.; Shriver, D.F.; Macromolecules, 1986, p. 347-350.*
Thomsen et al., "Liquid Crystal Elastomers with Mechanical Properties of a Muscle," *Macromolecules*, pp. 5868-5875 (2001).
Chiang et al., "Syntheses, Morphology and Dynamic Mechanical Properties of AB Crosslinked Polymers Based on Vinyl-Terminated Polyurethanes/Allyl Novolac Resin," *Applied Macromolecular Chemistry and Physics*, 230, pp. 159-169, (1995).

* cited by examiner

*Primary Examiner* — David W Wu
*Assistant Examiner* — Robert Jones, Jr.
(74) *Attorney, Agent, or Firm* — Hoffmann & Baron, LLP

(57) ABSTRACT

The invention relates to an actuator for converting between mechanical and electrical energy comprising—at least two electrodes; and—an electroactive polymer, comprising aromatic moieties in the chain and flexible moieties in the chain, the polymer further comprising side groups bound to the chain, which side groups are selected from the group consisting of polar side groups and side groups comprising an aromatic moiety. The invention further relates to a novel electroactive polymer comprising polar side groups bound to the chain.

25 Claims, 2 Drawing Sheets

ACTUATOR COMPRISING AN ELECTROACTIVE POLYMER

The invention relates to an electroactive polymer, to a composition comprising such polymer, to a method of making such polymer, to an actuator comprising such polymer and to the use of such polymer to convert energy from one form into another.

Polymer materials capable of converting electrical energy into mechanical energy and/or of converting mechanical energy into electrical energy (referred to herein as being electroactive) have been reported to be potentially interesting alternatives to common actuator technologies, such as electromagnetic motors, piezoelectric ceramics and solenoids.

US application 2004/0263028 relates to a transducer comprising a electroactive polymer selected from polymers based on homopolymerisable monoethylenically unsaturated monomers, thermoplastic elastomers and silicone based polymers. The actually described polymers tend to be relatively stiff (high E-modulus), are based on apolar monomers and/or have a relatively low electrical dielectric constant ($\in$). This puts limits to their processibility and/or their electroactive properties.

It is an object of the invention to provide a novel actuator comprising a polymer that can be used to convert electrical energy into mechanical energy and/or of converting mechanical energy into electrical energy.

It is in particular an object of the invention to provide a novel actuator comprising a polymer that has good processing properties.

It is a further object to provide a novel actuator comprising a polymer that can be deformed to a high extent in order to generate electrical energy.

Other objects which may be solved in accordance with the invention are indicated herein below.

It has now been found that one or more of the objects are solved by providing an actuator which comprises a polymer having specific moieties in the polymer chain and a having a specific class of side groups bound to the chain. Said side groups in particular have at least one property of a glass transition temperature reducing effect (Tg), a flexibility increasing effect and an $\in$ increasing effect as a common special technical feature.

Accordingly, the present invention relates to an actuator for converting between mechanical and electrical energy comprising
- at least two electrodes; and
- an electroactive polymer, comprising aromatic moieties in the chain and flexible moieties in the chain, the polymer further comprising side groups bound to the chain, which side groups are selected from the group consisting of polar side groups and side groups comprising an aromatic moiety.

FIG. 1 schematically shows how an extensional actuator may deform when electro-activated.

FIG. 2 shows deformation as a function of mechanical force at a fixed electrical field for a number of elastomer films.

FIG. 3 shows deformation as a function of electric field at a fixed mechanical force for a number of elastomer films.

In general, the electroactive polymer is or forms part of an elastomer, in particular a dielectric elastomer. A dielectric elastomer typically is capable of displaying electro-active behaviour associated with electrostatic pressure, such as Maxwell stress (Kwang Kim et al. "Standard testing methods for extensional and bending electroactive polymer actuators", Proceedings of the IMECE 2005, Nov. 5-11, 2005, Orlando, Fla., USA).

Such behavior should be distinguished from piezo-electric behavior. Unlike dielectric elastomers, piezo-electric polymers, generally show a relatively low mechanical strain under the application of a voltage, typically of less than 1% (Kwang Kim et. al:).

For instance, the abstract of JP 2006/049418 describes a piezo-electric polymer material. It is apparent that that the polymer material has a crystalline structure and has a high stiffness.

GB-A 2 188 585 also relates to a piezo-electric polymeric material of which it is apparent that it has a high stiffness.

An electro-active polymer according to the invention is typically mechanically deformable under influence of an electric potential, at least when provided with suitable electrodes. In particular, an electro-active polymer (at least when provided with suitable electrodes) or an attenuator according to the invention shows a deformation (expansion, contraction) of more than 1% (at 20 V/µm), more in particular or of at least 2% (at 20 V/µm), at room temperature (23° C.) and a relative humidity of 50%. Preferably, an electro-active polymer (at least when provided with suitable electrodes) or an attenuator according to the invention shows a deformation (expansion, contraction) of at least 5% at 20 V/µm, more preferably of at least 5% at 10 V/µm, at room temperature (23° C. and a relative humidity of 50%).

An actuator according to the invention may in particular be an extensional actuator, i.e. an actuator that expands or contracts upon application of an electric potential. The attenuator may be configured such that expansion/contraction occurs primarily in a single direction or primarily in two directions, e.g. as schematically shown in FIG. 1.

The invention also provides a bending actuator. Bending actuators are those whose dominant motion is a bending deformation upon application of an electric field. Such actuator may in particular comprise electrodes at different (opposite) sides of the electroactive polymer, wherein the electrode on a first side of the polymer has a lower stiffness than the electrode on a second (opposite) side. For instance, the electrode on the first side may be a metal, in particular a relatively ductile metal such as aluminum, tin or an alloy thereof, and the electrode on the second side may be a material having a relatively high stiffness such as graphite, or a relatively stiff metal.

The design of the actuator may be based on any actuator known in the art, in particular any such actuator comprising an electroactive polymer, e.g. as shown in US application 2004/0263028, US application 2004/232807, WO 03/056287, US application 2003/006669, WO 05/027161 or EP-A 1 512 215, The contents of these publications, in particular with respect to the design of the actuators described therein, more in particular with respect to the design of the actuators shown in the Figures and the description of the Figures in these publications are incorporated herein by reference.

The actuator may be manufactured, making use of techniques, which are known per se. In an embodiment, the electroactive polymer (which may be in a polymer composition) is shaped into a desired form, e.g. a film, a coating, a sheet or a 3D shape. Advantageously the polymer (composition) is in a flowable form, such as a melt, a solution, a fluid dispersion or a liquid mixture. This provides a high level of flexibility with respect to design. Suitable shaping techniques include spraying, casting, moulding, spin coating, dipping, extruding, printing, rapid manufacturing (3-D modelling, rapid prototyping).

In case the polymer is flowable, it is allowed to harden after shaping (such that it retains it shape without being supported), in particular to solidify.

After shaping, usually the at least two electrodes are applied to the shaped polymer such that they are in electrically conductive contact with the polymer. Suitable application techniques are known in the art and can routinely be chosen based upon the material of choice for the electrodes and include spraying, casting, moulding, spin coating, dipping, printing, rapid manufacturing (3-D modelling, rapid prototyping). The electrodes may be made of any electrically conductive material, in particular any material suitable for use in polymeric conductive devices. Such materials are known in the art and include materials selected from the group consisting of electrically conductive polymers and compositions comprising at least one of electrically conductive fillers, electrically conductive greases and electrically conductive particles.

The invention further relates to an electroactive polymer (suitable for use in an actuator), comprising aromatic moieties in the chain and flexible moieties in the chain, the polymer further comprising side groups bound to the chain, which side groups are selected from the group consisting of polar side groups and side groups comprising an aromatic moiety.

The flexible moiety in the electroactive polymer is in particular a moiety that contributes to a low glass transition temperature (Tg) of the polymer. More in particular, a moiety is considered flexible when it imparts a Tg of 0° C. or less, preferably of −20° C. The Tg may be as low as −100° C. or even lower. Accordingly, the polymer (or a composition comprising the polymer) preferably has a Tg of 0° C. or less, preferably of −20° C. or less, more preferably of −100 to −20°C. The Tg as used herein is the Tg as determinable by differential scanning calorimetry (DSC) at a heating rate of 10° C./min (10 mg sample, nitrogen atmosphere).

The skilled person will be able to select suitable moieties based on common general knowledge and the information disclosed herein. Preferred flexible moieties include (cyclo) aliphatic ether moieties, (cyclo)aliphatic ester moieties, (cyclo)aliphatic thioether moieties and (cyclo)aliphatic thioester moieties. A suitable flexible moiety is represented by the general formula —$R_x$-Fl-$R_y$— wherein Fl represents an ether, ester, thioether or thioester link and $R_x$ and $R_y$ represent the same or different linear or branched alkylene or cycloalkylene, preferably a C1-C6 alkylene or a C5-C6 cycloalkylene.

The aromatic moieties in the chain and/or in the side groups preferably have 6-20 carbon atoms. The aromatic moieties typically comprise one or more aromatic rings. Particularly suitable are optionally substituted phenyl groups, optionally substituted anthracene groups and optionally substituted naphthalene groups. An aromatic moiety comprising a phenyl group is particularly preferred.

The inventors have come to the insight that the provision of a polymer with side groups, in particular such that the polymer becomes a branched polymer, is advantageous with respect to its usefulness as an electroactive polymer in an actuator. In particular the inventors contemplated that the side groups contribute to improving the mechanical properties (lower stiffness; reduced Tg) and/or increasing $\in$.

The presence of an aromatic moiety as (part of) a side group is in particular considered advantageous for reducing the stiffness of the material. It usually has a (relatively strong) Tg lowering effect, compared to a polymer that is the same except for the presence of side groups comprising the aromatic moiety.

Preferred polar moieties as (part of) the side groups include moieties selected from the group consisting of —OH, —CN, —$NH_2$, —$NO_2$, aryloxy (such as -phenoxy), -phenyl, halogens (such as —Cl, —F, —I, —Br), —(CO)($NH_2$)—, —COOH, —(CO)(NHR)—, —(CO)(NRR)—NHR and NRR. In these moieties each R independently represents an alkyl which may be substituted or unsubstituted, in particular a substituted or unsubstituted C1-C6 alkyl.

The presence of a polar side group is in particular considered advantageous with respect to increasing the dielectric constant $\in$. It usually also has a Tg lowering effect.

A preferred polymer (in an actuator) of the invention comprises both side groups with aromatic moieties and side groups with polar moieties, side groups with both aromatic moieties and polar moieties, or a combination thereof.

Good results have been achieved with a polyurethane-(alkyl)acrylate copolymer according to the invention (comprising said moieties in the chain and said side groups. Preferably at least part of (alkyl)acrylate units are based on a monomer represented by formula I and/or formula II

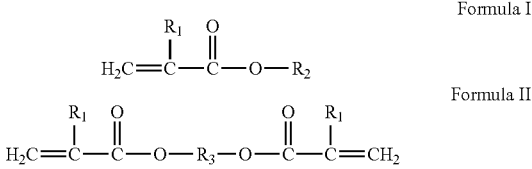

wherein each $R_1$ is independently hydrogen, an optionally substituted alkyl (in particular methyl) or a polar moiety
wherein $R_2$ is a polar moiety, an aromatic moiety (as defined above, and preferably an aromatic moiety containing a phenyl group) an optionally substituted alkyl or hydrogen provided that at least one or $R_1$ and $R_2$ is a polar moiety or an aromatic moiety.

$R_3$ comprises at least one aromatic moiety based on an aromatic diisocyanate, in particular on an aromatic diisocyanate selected from the group consisting of toluenediisocyanate (TDI) and methylene diphenyl isocyanate (MDI).

Such a polymer has been found to have a suitable E-modulus and $\in$ such that it may be used in an actuator. Such a polymer has been found favourable in that it can be processed easily. Advantageously such polymer may be flowable at room temperature, which makes it easy to shape it into any desired form and thickness by diverse techniques.

Preferably at least part of the aromatic moieties in the chain are based on an aromatic diisocyanate, in particular on an aromatic diisocyanate selected from the group consisting of toluenediisocyanate (TDI) and methylene diphenyl isocyanate (MDI).

For use in an actuator, the polymer preferably has a dielectric constant $\in$, as determinable by dielectric relaxation spectroscopy at room temperature (23° C.), 50% relative humidity (RH) and a frequency of 20 Hz of at least 10, more preferably of at least 15, even more preferably more than 20.

The upper limit is not particularly critical. In principle it may be 100 or more. For practical reasons $\in$ may be 100 or less, more in particular 75 or less, or 50 or less.

A preferred polymer of the invention has a relatively low E-modulus, as determinable by a tensile tester at room temperature (23° C.), 50% RH and a tensile speed of 5 mm/min. In particular for use in an actuator the E-modulus is preferably 20 MPa or less, more preferably 10 MPa or less. For practical reasons, the E-modulus is usually at least 0.1 MPa.

For improving mechanical stability, the polymer may be cross-linked. For improving strength and/or tear resistance the number of cross-links is preferably at least 0.0005 mol cross-links per 1000 g, more preferably at least 0.001 cross-links per 1000 g. In view of maintaining an advantageously low E-modulus, the amount of cross-links is preferably less than 0.4 mol cross-links per 1000 g, more preferably less than 0.2 mol cross-links per 1000 g.

The polymer (used) according to the invention preferably has a weight average molecular weight (Mw) of at least 5 000 g/mol. For improved strength (such as resistance against tearing) Mw is preferably at least 20 000g/mol. For favourable deformation properties, Mw is preferably 200 000 g/mol or less, in particular 150 000 g/mol or less. The Mw as used herein is the Mw, as determinable by GPC using polystyrene standards, of the polymer in an non-cross-linked state.

The polymer may be used as such or form part of a polymer composition. Such composition comprises a polymer of the invention and one or more other components. The electroactive polymer concentration is preferably at least 50 wt. %, more preferably at least 60 wt. %. The upper limit is not particularly critical and may be 99 wt. % of the composition or more.

In particular one or more components may be present such as one or more components selected from other polymers, additives having an $\in$-increasing effects etc. In particular when the composition is to be used in an actuator, the additives are usually chosen in an amount such that the E modulus is less than 20 MPa, preferably 0.1-10 MPa and/or $\in$ is at least 10, preferably more than 15, in particular 25-100.

Preferred additives include carbon nanotubes having a high $\in$, (ceramic) particles having a high $\in$ and organic polarisable compounds having a high $\in$ (in particular having a higher $\in$ than the polymer, more in particular an $\in$ of at least 50). Examples of such particles include $BaTiO_3$, lead zirconate titanate (PZT) and other ferroelectric ceramic particles. Examples of polarisable compounds include aromatic conjugated Organic molecules, such as phtalocyanine derivatives.

Such other components may be used in an amount in the range of 0.1 to 40 wt. %.

In an advantageous embodiment, the polymer composition (used) according to the invention comprises at least one (organic polarisable) compound represented by the formula
$P_1$—$Ar_1$—X—$Ar_2$—$P_2$
wherein
$P_1$ and $P_2$ are the same or different polar moieties, preferably selected from the group consisting of —OH, —CN, —$NH_2$, NHR, NRR, —$NO_2$, aryloxy, -phenyl, halogens, —(CO)($NH_2$)—, —(CO)(NHR)—(CO)(NRR) and —COOH, wherein each R is the same or a different C1-C6 substituted or unsubstituted alkyl group, and more preferably at least one of $P_1$ and $P_2$ is selected from —$NH_2$ and —$NO_2$, —NHR, —NRR, a hydroxyl, a cyanide and a carbonyl group;
$Ar_1$ and $Ar_2$ are aromatic moieties, preferably as defined above, more preferably a moiety comprising an (optionally substituted) aromatic C-6 ring;
and X represents a moiety comprising a double bound, preferably a C=C or N=N bond.

Particularly suitable examples of polarisable compounds include Disperse Red 1 and Disperse Orange 3.

Such a compound may be used in a polymer to improve its electroactive properties, in particular it may be used to increase $\in$.

Such compound may be present in a concentration of 0.1 to 30 wt. % of the total composition.

The polymer (used) in accordance with the invention may be prepared based upon any method known in the art.

In an embodiment a polymer (used) according to the invention is prepared by polymerising a mixture containing (a) at least one monomer comprising at least one polar side group and/or at least one aromatic side group (such as the (alkyl) acrylate) and (b) at least one component selected from monomers and prepolymers providing the aromatic moiety in the chain of the polymer which is prepared (such as isocyanate monomers and urethane-(alkyl)acrylate prepolymers, wherein the prepolymer optionally comprises one or more (alkyl)acrylate units which comprise at least one polar side group). A prepolymer is a polymer containing one or more functional groups, such that it can be further polymerised. The prepolymer may for instance be polymerised aided by UV light and/or thermal energy.

Advantageously in the preparation of the polymer, the mixture comprises (a) 15-90 wt. % of the monomer comprising at least one polar side group and/or at least one aromatic side group (based on the total weight of the used ingredients to prepare the polymer from) and (b) 5-75 wt. % of the component selected from monomers and prepolymers providing the aromatic moiety in the chain of the polymer which is prepared.

The polymer may be used as such or in a polymer composition to manufacture an actuator.

The invention further relates to an article comprising a polymer, and in particular an actuator according to the invention.

In particular the article may be selected from the group consisting of parts for a motor vehicle (adjustable mirrors, pumps, injectors, windscreen wipers, seats), sports articles (skis, helmets, knee protectors, elbow protectors, shinbone protectors, protectors for other body parts), textiles, shoes, healthcare articles (rehabilitation articles, surgical devices, implantable valves, pacemakers, catheters (guidable), supportive clothing, artificial muscles, microsystems (moveable parts in electronic equipment such as DVD/CD players, disk drives, microlocks, microswitches, cameras (focus, zoom), speakers, microphones, anti-vibration materials), pumps, valves, drives, anti-theft tags, packings, gaskets, devices for inducing peristaltic movement.

The actuator (respectively polymer or polymer composition) of the invention may in particular be used to convert mechanical energy into electrical energy and/or to convert electrical energy into mechanical energy.

In an embodiment a polymer, composition or an actuator according to the invention is used to make the roughness of a surface adjustable, as a massaging facility, to influence the aerodynamic behavior of a surface, to make insulating properties of an article adjustable, to make stretchability of an article adjustable or to improve support, comfort or protective properties of an article.

The invention will now be illustrated by the following examples.

EXAMPLE 1

The following materials were used to prepare electroactive polymers:

Actilane 170 (A170), aromatic urethane diacrylate, supplied by AKZO Nobel.

Actilane 410 (A410), phenoxyethyl acrylate, supplied by AKZO Nobel.

Hexamethylenediacrylate (HDDA) (crosslinker), supplied by UCB

β-Cyanoethylacrylate (CEA), supplied by ABCR 2-hydroxy-2-methyl-1-phenyl-propane-1-on (D1173) (Darocure 1173 photoinitiator), supplied by Ciba, Darocure TPO (TPO photoinitiator), supplied by Ciba.

The ingredients were mixed in several ratios (see Table 1) and polymerisation was carried out as follows: the mixture was applied on to a glass substrate in a thin film (50-200 μm) and cured by means of a type H UV lamp for 30 seconds in a nitrogen athmosphere.

$\epsilon_r$ was measured at 23° C. and 50% RH using a Hewlett Packard 4284A precision LCR-meter for frequencies between 20 Hz and 500 kHz, breakdown voltage ($V_{break}$) was measured at 23° C. and 50% RH using a high voltage source by increasing the applied voltage until electric breakdown occured and E was measured at 23° C. and 50% RH using a home-built tensile tester with a load-cell of 250 g and a speed of 5 mm/min. The results are shown in Table 1.

TABLE 1

| TEST # | A170 | A410 | CEA | HD | D1173 | TPO | $\epsilon_r$ | $V_{break}$ (V/μm) | E (MPa) |
|---|---|---|---|---|---|---|---|---|---|
| A | 25 | 60 |    | 10 | 5 |   | 12.7 | 49 | 14 |
| B | 25 | 40 | 20 | 10 | 5 |   | 13.9 | 49 | 12 |
| C | 25 | 30 | 30 | 10 | 5 |   | 11.5 | 29 | 13 |
| D | 25 | 75 |    |    | 5 |   | 10.8 | 25 | 4.4 |
| E | 12.5 | 87.5 |  |    | 5 |   | 11.5 | 26 | 3.9 |
| F | 5 | 95 |    |    | 5 |   | 13.8 |    | 3.0 |
| G | 25 | 75 |    |    |   | 5 | 13.5 |    | 3.7 |
| H | 12.5 | 87.5 |  |    |   | 5 | 15.6 |    | 3.2 |
| I | 5 | 95 |    |    |   | 5 | 16.5 |    | 3.1 |
| J | 25 | 75 |    |    | 2 | 2 | 10.3 |    | 4.2 |
| K | 25 | 55 | 20 |    | 2 | 2 | 11.3 |    | 4.1 |
| L | 25 | 75 | 20 |    | 3 | 3 | 12.0 |    | 3.7 |
| M | 25 | 75 |    |    | 4 | 4 | 11.8 |    | 4.5 |
| N | 25 | 55 | 20 |    | 4 | 4 | 12.6 |    | 3.9 |
| O | 25 | 75 |    |    | 5 | 5 | 11.5 |    | 3.5 |
| P | 25 | 55 | 20 |    | 5 | 5 | 14.2 |    | 4.2 |

(all components are identified in weight %)

EXAMPLE 2

Mixtures of Actilane 170, Actilane 410 and β-Cyanoethylacrylate were made containing 0.5 w % Darocure 4265 (photo-initiator). These mixtures were cast into 100-200 μm thick films on glass slides and cured by means of a type H UV lamp for 20 seconds in a nitrogen atmosphere. The films were characterised using the same techniques as given in Example 1. The results are listed in Table 2. Of these examples, film 2G showed a particular advantageous combination of properties.

TABLE 2

| # | A170 | A410 | CEA | E (MPa) | Tensile Str. (MPa) | Elong. at break (%) | $\epsilon_r$ | $V_{break}$ (V/μm) |
|---|---|---|---|---|---|---|---|---|
| 2A | 33 | 33 | 33 | 1.37 | 0.42 | 43 | 11.9 | 32 |
| 2B | 20 | 60 | 40 | 1.16 | 0.39 | 42 | 13.3 | 29 |
| 2C | 25 | 25 | 50 | 1.26 | 0.61 | 91 | 15.6 | >40 |
| 2D | 20 | 40 | 40 | 1.22 | 0.54 | 65 | 14.0 | 17 |
| 2E | 40 | 20 | 40 | 1.79 | 0.91 | 77 | 12.1 | 20 |
| 2F | 40 | 40 | 20 | 1.72 | 0.52 | 37 | 10.6 | >40 |
| 2G | 33 | 17 | 50 | 1.40 | 0.87 | 102 | 13.5 | >40 |
| 2H | 33 | 50 | 17 | 1.32 | 0.38 | 35 | 11.7 | >40 |
| 2I | 17 | 50 | 33 | 0.92 | 0.28 | 42 | 13.5 | >40 |
| 2J | 17 | 33 | 50 | 0.68 | 0.34 | 73 | 11.2 | 26 |
| 2K | 10 | 50 | 40 | 0.93 | 0.35 | 49 | 14.9 | 17 |
| 2L | 18 | 54 | 28 | 0.96 | 0.20 | 24 | 13.2 | 25 |
| 2M | 5 | 80 | 15 | 1.34 | 0.24 | 20 | 12.9 | 19 |
| 2N | 10 | 70 | 20 | 0.92 | 0.26 | 33 | 10.8 | 24 |
| 2O | 10 | 45 | 45 | 0.81 | 0.29 | 49 | 13.2 | 17 |
| 2P | 18 | 46 | 36 | 0.99 | 0.40 | 52 | 11.6 | 22 |
| 2Q | 0 | 60 | 40 | 0.48 | 0.12 | 30 | 12.2 | 16 |
| 2S | 18 | 72 | 10 | 0.98 | 0.21 | 25 | 10.6 | 28 | all components are identified in weight %

EXAMPLE 3

A dielectric elastomer film was manufactured according to examples 2F and 2G respectively. Characterisation of the performance of the actuator material was done by measuring the deformation of the film versus the applied force and electric field. FIG. 1 schematically shows how the film deformed, upon electro-activation.

A membrane was placed and fixed over a circular hole. Both sides of the film were coated with a flexible graphite electrode. Weights ranging from 0.05 to 0.5 N were placed on the membrane and the vertical movement due to the applied electric field, was measured using a cathetometer.

Three films were tested: a commercial acrylic elastomer (VHB 4910 adhesive tape: Scotch; as reference) and two aromatic urethane acrylates, having a relatively high (2G) and a relatively low (2F) amount of cyanoethylacrylate. The film thicknesses ranged between 50 and 70 μm. The results at an electric field of 20 V/μm and an applied force ranging from 0,05 to 0.5 N are shown in FIG. 2. The results at a force of 0.25 N and an applied electric field ranging from 10 to 50 V/μm are shown in FIG. 3.

The invention claimed is:

1. An actuator for converting between mechanical and electrical energy comprising
    at least two electrodes; and
    an electroactive dielectric elastomer, comprising aromatic moieties in the chain and flexible moieties in the chain, the electroactive dielectric elastomer further comprising side groups bound to the chain, which side groups are selected from the group consisting of polar side groups and side groups comprising an aromatic moiety, the electroactive dielectric elastomer having a glass transition temperature (Tg) of 0° C. or less and a dielectric constant, as determined by dielectric relaxation spectroscopy at 23° C., 50% relative humidity and a frequency of 20 Hz, of at least 10,
    wherein the actuator is suitable for converting mechanical energy into electrical energy and for converting electrical energy into mechanical energy.

2. Actuator according to any claim 1, wherein the flexible moieties of the polymer are selected from the group consisting of (cyclo)aliphatic ether moieties, (cyclo) aliphatic ester moieties, (cyclo) aliphatic thioether moieties and (cyclo) aliphatic thioester moieties.

3. Actuator according to claim 1, wherein the aromatic moieties in the chain and—when present—in the side groups are selected from unsubstituted and substituted aromatic moieties having 6-20 carbon atoms.

4. Actuator according to claim 1, wherein the side groups comprise a moiety selected from the group consisting of —OH, —CN, —NH$_2$, —NO$_2$, aryloxy, -phenyl, halogens, —COOH, NHR, NRR, —(CO)(NH$_2$)—, —(CO)(NHR) and —(CO)(NRR), wherein each R is the same or a different C1-C6 substituted or unsubstituted alkyl group.

5. Actuator according to claim 1, wherein the polymer has a dielectric constant of at least 10.

6. Actuator according to claim 1, wherein the polymer has an E-modulus of 20 MPa or less.

7. Actuator according to claim 1, wherein the electroactive polymer has a glass transition temperature (Tg) of −100 to −20 °C.

8. Actuator according to claim 1, wherein the polymer is a polyurethane-(meth)acrylate copolymer comprising aromatic urethane units and (alkyl)acrylate units.

9. Actuator according to claim 8, wherein at least part of (alkyl)acrylate units are based on a monomer represented by formula I

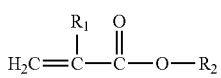

Formula I wherein

R$_1$ is hydrogen, an optionally substituted alkyl or a polar moiety;

R$_2$ is a polar moiety, an aromatic moiety, an optionally substituted alkyl or hydrogen;

provided that at least one or R$_1$ and R$_2$ is a polar moiety or an aromatic moiety.

10. Actuator according to claim 1, wherein at least part of the aromatic moieties in the chain are based on aromatic diisocyanate.

11. Method for preparing an actuator according to claim 1, comprising shaping the electroactive polymer, the polymer being in a flowable form;

allowing the polymer to harden; and applying at least two electrodes to the shaped polymer such that they are in electrically conductive contact with the polymer.

12. Actuator according to claim 1, wherein the polymer has a dielectric constant of at least 15.

13. Actuator according to claim 1, wherein the polymer has a dielectric constant of between 20 and 100.

14. Actuator according to claim 1, wherein the polymer has an E-modulus of 0.1-10 MPa.

15. Actuator according to claim 1, wherein the polymer has a Tg of −100 to −20 °C.

16. Actuator according to claim 8, wherein at least part of (alkyl)acrylate units are based on a monomer represented by formula I

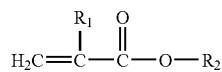

Formula I wherein

R$_1$ is hydrogen, methyl or a polar moiety;

R$_2$ is a polar moiety, an aromatic moiety comprising a phenyl, an optionally substituted alkyl or hydrogen;

provided that at least one or R$_1$ and R$_2$, is a polar moiety or an aromatic moiety.

17. Actuator according to claim 1, wherein at least part of the aromatic moieties in the chain is based on an aromatic diisocyanate selected from the group consisting of toluene-diisocyanates and methylene diphenyl isocyanate.

18. Actuator according to claim 1, wherein the polymer is a dielectric elastomer.

19. Actuator according to claim 1, wherein the flexible moieties are selected from (cyclo)aliphatic ether moieties, (cyclo)aliphatic thioether moieties and (cyclo)aliphatic thioester moieties.

20. An actuator for converting between mechanical and electrical energy comprising at least two electrodes; and an electroactive dielectric elastomer, comprising aromatic moieties in the chain and flexible moieties in the chain, the electroactive dielectric elastomer further comprising polar side groups bound to the chain, the electroactive dielectric elastomer having a glass transition temperature (Tg) of 0 °C or less and a dielectric constant, as determined by dielectric relaxation spectroscopy at 23° C., 50% relative humidity and a frequency of 20 Hz, of at least 10, wherein the actuator is suitable for converting mechanical energy into electrical energy and for converting electrical energy into mechanical energy.

21. Actuator according to claim 20, wherein the polar side groups comprise moieties selected from the group consisting of —OH, —CN, —NH$_2$, —NO$_2$, aryloxy, —(CO)(N H$_2$)—, —COOH, —(CO)(NHR)—, —(CO)(NRR) —NHR and NRR, wherein each R independently represents an unsubstituted or a substituted alkyl.

22. Actuator according to claim 20, wherein the flexible moieties of the polymer are selected from (cyclo)aliphatic ether moieties and (cyclo) aliphatic ester moieties.

23. Actuator according to claim 1, wherein the electroactive dielectric elastomer shows deformation of more than 1% at 20 V/µm at 23 °C. and a relative humidity of 50%.

24. Actuator according to claim 1, wherein the actuator is suitable for converting mechanical energy into electrical energy and for converting electrical energy into mechanical energy at a substantially constant temperature.

25. Actuator according to claim 1, wherein the actuator expands or contracts upon application of an electric potential.

* * * * *

UNITED STATES PATENT AND TRADEMARK OFFICE
CERTIFICATE OF CORRECTION

PATENT NO. : 8,258,238 B2
APPLICATION NO. : 12/294985
DATED : September 4, 2012
INVENTOR(S) : Arjen Boersma It is certified that error appears in the above-identified patent and that said Letters Patent is hereby corrected as shown below:

IN THE PATENT:

Please add to column 1, after the title and before line 1,

--This application is U.S. National Phase of, and Applicants claim priority from. International Application Number PCT/NL2007/050138 filed April 4, 2007, and European Patent Application Number 06075808.3 filed April 5, 2006, which are incorporated herein by reference.

BACKGROUND OF THE INVENTION--

Column 1, after line 23, please insert the following heading:

--SUMMARY OF THE INVENTION--

Column 1, after line 53, please insert the following heading:

--BRIEF DESCRIPTION OF THE DRAWINGS--

Column 2, before line 1, please insert the following heading:

--DETAILED DESCRIPTION OF THE DRAWINGS--

Figure 1:
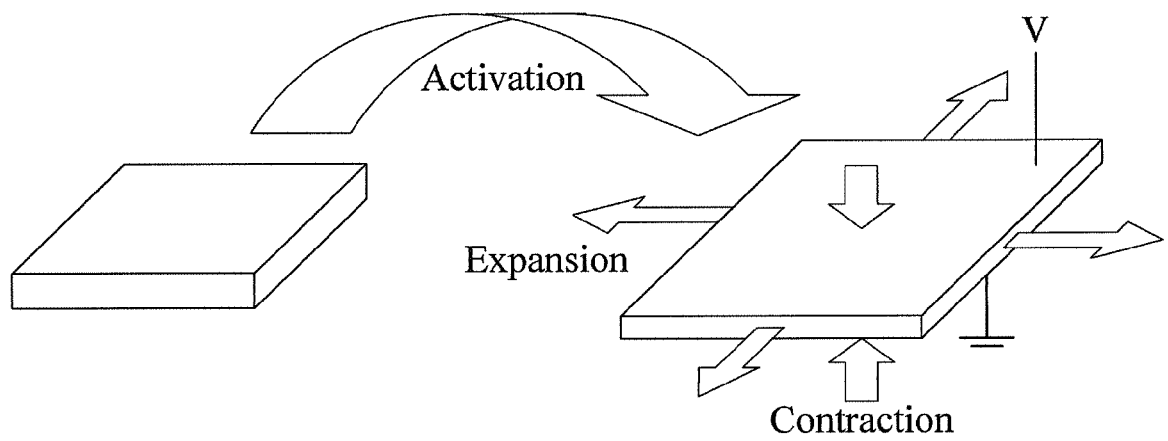
Figure 2:
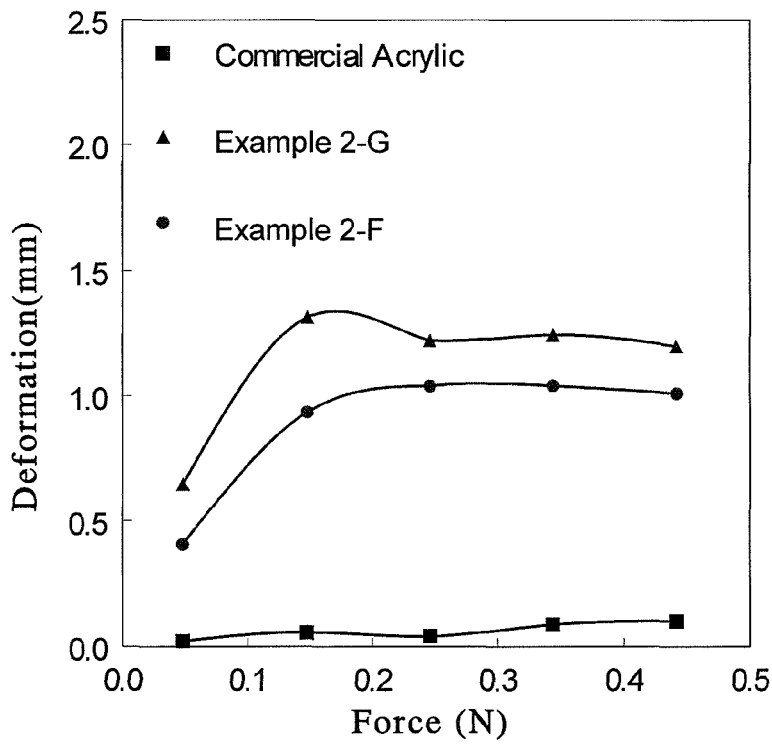
Figure 3:
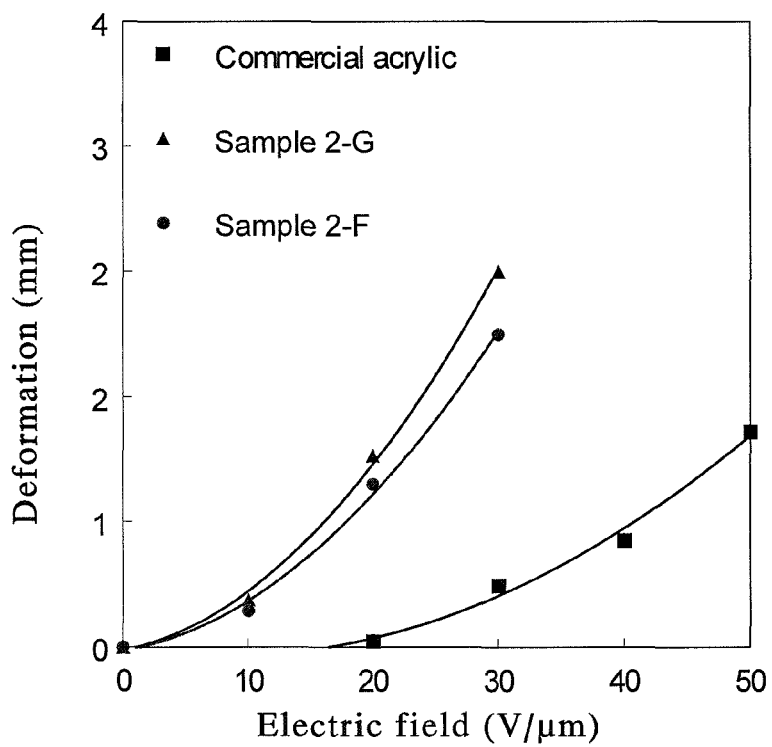

Column 1, line 67:

Now reads: "Fla., USA)."

Should read: --FL., USA).--

Signed and Sealed this
Nineteenth Day of February, 2013

Teresa Stanek Rea
*Acting Director of the United States Patent and Trademark Office*

CERTIFICATE OF CORRECTION (continued)
U.S. Pat. No. 8,258,238 B2

Column 5, line 55:

Now reads: "a double bound,"

Should read: --a double bond--

Column 6, before line 54, please insert the following heading:

--EXAMPLES--